United States Patent
Teissier et al.

(10) Patent No.: US 11,675,114 B2
(45) Date of Patent: Jun. 13, 2023

(54) MONOLITHIC STRUCTURED LIGHT PROJECTOR

(71) Applicant: II-VI Delaware, Inc., Wilmington, DE (US)

(72) Inventors: Jean Axel Edmond Teissier, Hegenheim (FR); Julien Boucart, Zurich (CH)

(73) Assignee: II-VI Delaware, Inc., Wilmington, DE (US)

( * ) Notice: Subject to any disclaimer, the term of this patent is extended or adjusted under 35 U.S.C. 154(b) by 553 days.

(21) Appl. No.: 16/042,319

(22) Filed: Jul. 23, 2018

(65) Prior Publication Data

US 2020/0025985 A1   Jan. 23, 2020

(51) Int. Cl.
*G02B 5/18* (2006.01)
*H01S 5/183* (2006.01)
*H01S 5/42* (2006.01)
*H01S 5/0234* (2021.01)

(52) U.S. Cl.
CPC ......... *G02B 5/1842* (2013.01); *G02B 5/1828* (2013.01); *G02B 5/1857* (2013.01); *H01S 5/0234* (2021.01); *H01S 5/183* (2013.01); *H01S 5/423* (2013.01)

(58) Field of Classification Search
CPC ...... H01S 5/18388; H01S 5/005; H01S 5/183; H01S 5/423; H01S 5/0224; H01S 5/02296; H01S 2301/20; G02B 5/1819; G02B 5/1857; G02B 5/1828; G02B 27/20; G02B 27/0944; G02B 5/1842; G01B 11/25
USPC ............ 359/573, 575, 15; 372/102; 356/610
See application file for complete search history.

(56) References Cited

U.S. PATENT DOCUMENTS

| | | | |
|---|---|---|---|
| 6,487,015 B2 * | 11/2002 | Kitamura | G02B 5/1819 359/15 |
| 6,545,808 B1 * | 4/2003 | Ehbets | G02B 5/1857 359/15 |
| 8,599,484 B2 | 12/2013 | Miyasaka et al. | |
| 8,749,796 B2 | 6/2014 | Pesach et al. | |
| 9,477,018 B2 | 10/2016 | Miyasaka et al. | |
| 9,825,425 B2 | 11/2017 | Mor | |
| 9,885,459 B2 | 2/2018 | Freedman et al. | |
| 2007/0241933 A1 * | 10/2007 | Price | G01S 7/4813 340/904 |
| 2010/0284082 A1 | 11/2010 | Shpunt et al. | |

(Continued)

FOREIGN PATENT DOCUMENTS

WO   WO 2014/203110   12/2014

OTHER PUBLICATIONS

US 8,653,430 B2, 02/2014, Akerman et al. (withdrawn)

*Primary Examiner* — Audrey Y Chang
(74) *Attorney, Agent, or Firm* — Wendy W. Koba

(57) ABSTRACT

A structured light projector for generating a far-field image of light dots in a defined pattern is proposed, where the structured light projector includes a light source providing as an output a non-collimated light beam and a specialized diffractive optical element disposed to intercept the non-collimated light beam. The specialized diffractive optical element is formed to exhibit a non-uniform pattern of grating features configured to compensate for the non-planar wavefront and phase retardation of the non-collimated output beam, providing as an output of the projector an interference pattern of light dots exhibiting the desired configuration.

1 Claim, 5 Drawing Sheets

RANDOM DOT PATTERN

(56) References Cited

U.S. PATENT DOCUMENTS

| | | |
|---|---|---|
| 2011/0188054 A1 | 8/2011 | Petronius et al. |
| 2012/0038986 A1 | 2/2012 | Pesach |
| 2013/0038881 A1* | 2/2013 | Pesach .................. G01B 11/25 |
| | | 356/610 |
| 2013/0136305 A1 | 5/2013 | Shpunt et al. |
| 2014/0268341 A1 | 9/2014 | Tam et al. |
| 2014/0321495 A1* | 10/2014 | Fattal .................. H01S 5/18388 |
| | | 372/102 |
| 2016/0286202 A1* | 9/2016 | Romano .................. G01S 17/46 |
| 2016/0377414 A1 | 12/2016 | Thuries et al. |
| 2017/0131560 A1 | 5/2017 | Liao et al. |

* cited by examiner

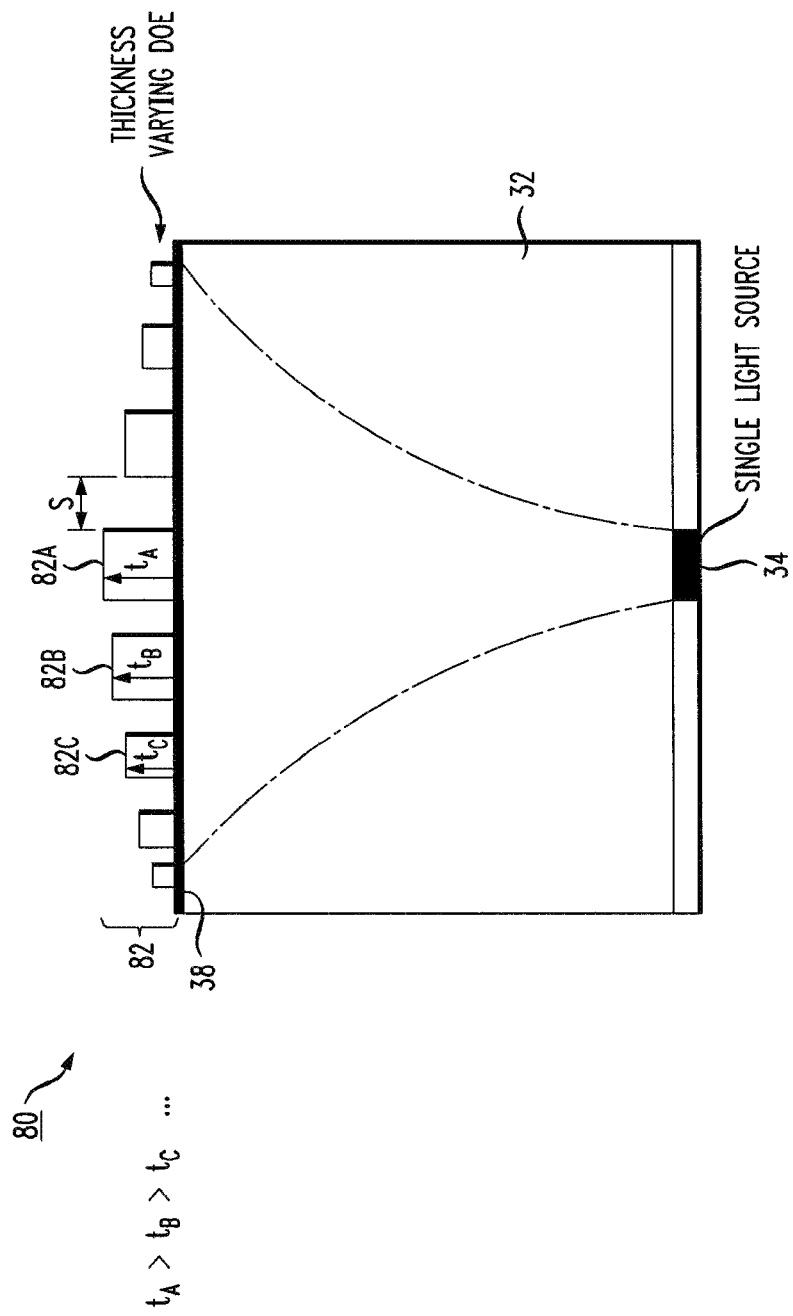

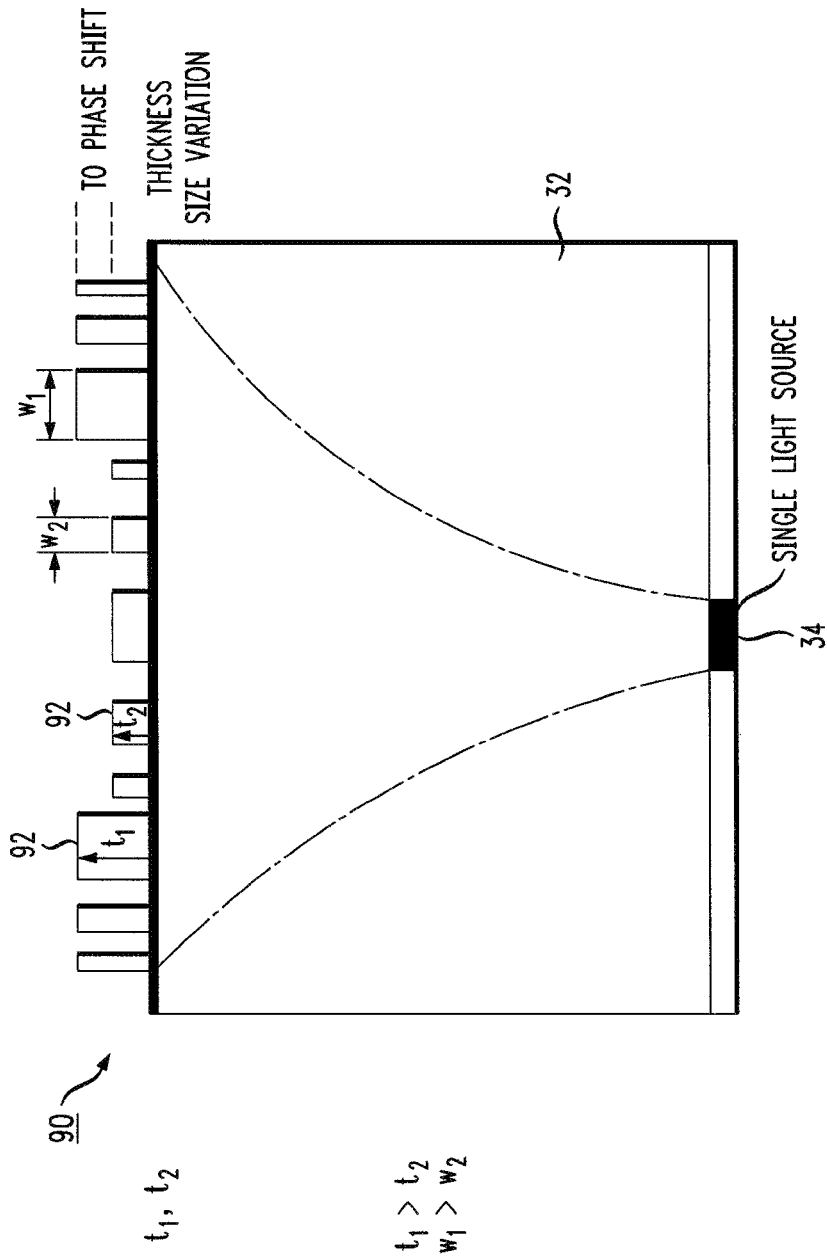

MONOLITHIC STRUCTURED LIGHT PROJECTOR

TECHNICAL FIELD

The present invention relates to a structured light projector and, more particularly, to a monolithic structured light projector that eliminates the need for a separate collimator to provide beam shaping.

BACKGROUND OF THE INVENTION

Structured light projectors are being developed for applications where specific patterns of light "dots" are used to cast a pattern of coded light or information. Applications such as 3D sensing, mapping, and the like depend on the use of this type of optical source. FIG. 1 is a simplified diagram of a typical prior art structured light projector, including a laser diode 1 that emits a beam B. As shown, the beam is divergent as it exits laser diode 1. The diverging beam is then directed into a collimating lens 2 that functions to focus (shape) the diverging beam into a set of parallel rays (i.e., a collimated beam) that presents a planar wavefront. The collimated beam is then directed into a diffractive optical element (DOE) 3 that functions to redirect some of the rays so as to create an interference pattern of light dots, such as shown in FIG. 2. The pattern of light dots is formed by the introduction of a set of phase delays across the wavefront of the collimated beam as it passes through the gratings of the DOE. Various types of diffractive elements used for this purpose are well known in the art and include, among others, refractive curved surfaces, Fresnel lenses, and the like.

While useful in providing the structured light output, the combination of the collimator and the DOE needs to be carefully aligned (to each other as well as to the light source) so that the desired pattern is created. The alignment tolerances necessarily add to the expense of the projector, as well as to the time and effort required to manufacture the assembly. The tight alignment tolerances also impact the packaging requirements. The use of individual, discrete components impacts the size of the projector itself, particularly in applications where it is desired to utilize an array of such projectors to create more extensive and/or complicated patterns of light dots.

SUMMARY OF THE INVENTION

The needs remaining in the art are addressed by present invention, which relates to a structured light projector and, more particularly to a monolithic, integrated structured light projector that eliminates the need for a separate collimator component and in an exemplary embodiment may be fabricated directly onto a laser diode light source itself.

In accordance with the present invention, a specialized diffractive optical element ("specialized DOE") is used in combination with a light source to generate the desired dot pattern output. In particular, the specialized DOE is formed to exhibit a variable diffraction pattern that compensates for the non-collimated beam exiting the laser so that the beam shape and phase retardation associated with the laser output may be matched by the diffraction pattern of the specialized DOE. More particularly, the diffraction pattern formed in the specialized DOE is configured to include non-uniform spacing and/or thickness of included features to counteract the phase delay inherent across the wavefront of the non-collimated beam. For applications where it is desired to create an array of light dots (such as shown in FIG. 2), the non-uniformity of the features forming the specialized DOE evolves in directions away from the center of the beam, matching the phase retardation of the non-collimated beam as it reaches the specialized DOE. Other configurations of non-uniformity are contemplated as included within the scope of the present invention and may be used to create specialized dot patterns for particular applications. The pattern of dots may take the form of a regular array, or a random pattern (pseudo-random in most cases), as shown in FIG. 2.

One exemplary embodiment of the present invention utilizes a vertical cavity surface emitting laser (VCSEL) that is oriented on a supporting substrate such that its emission passes through the thickness of the substrate, with in one case the specialized DOE fabricated directly on the surface of the substrate. This integrated configuration thus provides a monolithic structured light projector that is extremely compact and reliable.

Various embodiments of the present invention may utilize integrated arrays of light sources, disposed so that their divergent beams do not overlap. The diffraction pattern is created to provide proper compensation for the divergence of the array of beams. The arrays may be one-dimensional or two-dimensional.

Other embodiments of the present invention may be formed using a discrete light source in combination with a discrete specialized DOE (as opposed to the monolithic, integrated configuration). Inasmuch as the specialized DOE eliminates the need for a separate collimator, even these embodiments utilizing a discrete specialized DOE will be more compact than their prior art counterparts (and also eliminate the collimator-DOE alignment process).

An exemplary embodiment of the present invention takes the form of a structured light projector for generating a far-field image of light dots in a defined pattern, the projector comprising a light source providing as an output a non-collimated light beam and a specialized diffractive optical element disposed to intercept the non-collimated light beam. The specialized diffractive optical element itself is formed to comprise a non-uniform pattern of a plurality of grating features configured to both compensate for wavefront and phase retardation of the non-collimated beam, and diffract the compensated beam to create as an output an interference pattern of light dots exhibiting the defined pattern.

Other and further embodiments of the present invention will become apparent during the course of the following discussion and by reference to the accompanying drawings.

BRIEF DESCRIPTION OF THE DRAWINGS

Referring now to the drawings,

FIG. 7 shows another embodiment of the present invention, in this case utilizing a non-uniform thickness in the layer of material forming the specialized DOE, the changing thickness configured to compensate for the diverging beam; and FIG. 8 illustrates yet another embodiment of the present invention, where the specialized DOE is formed to include both non-uniform spacing and non-uniform thickness to compensate for beam divergence.

DETAILED DESCRIPTION

Figure 1:
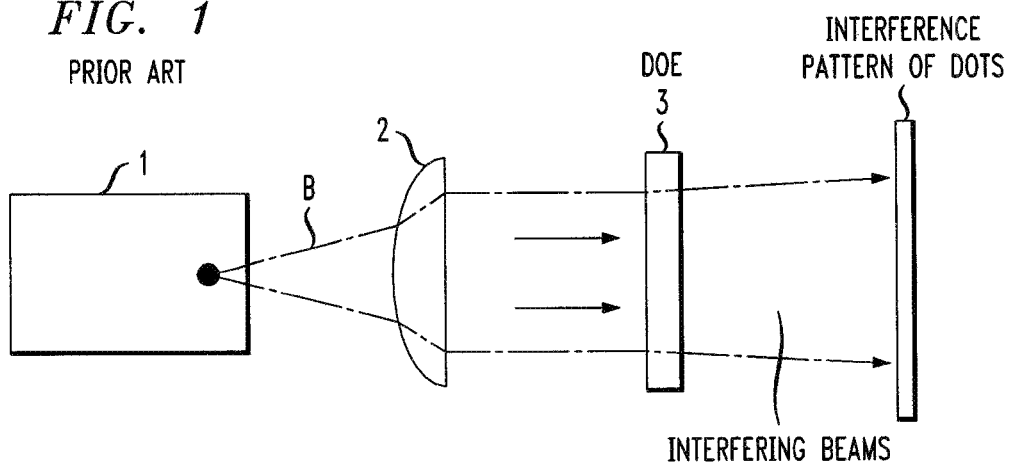
FIG. 1 is a simplified diagram of a prior art dot projector.
Figure 2:
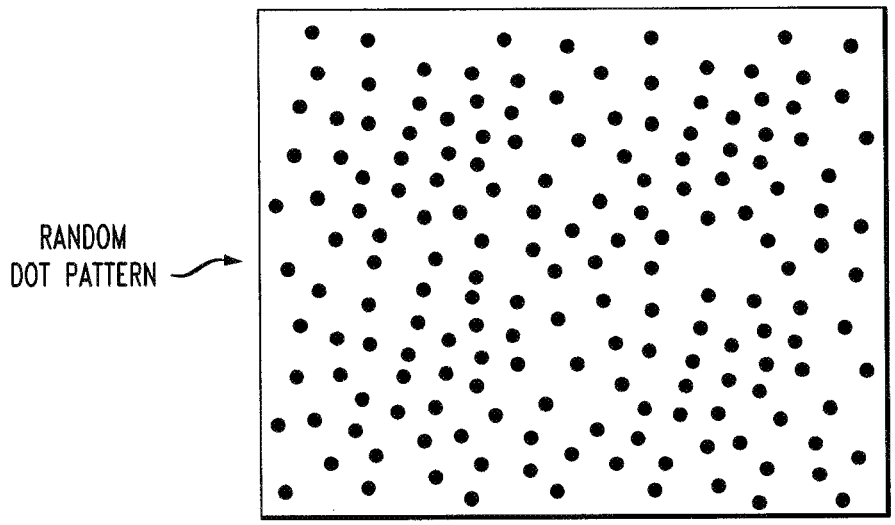
FIG. 2 illustrates an exemplary dot pattern created by the interference of rays passing through a DOE.
Figure 3:
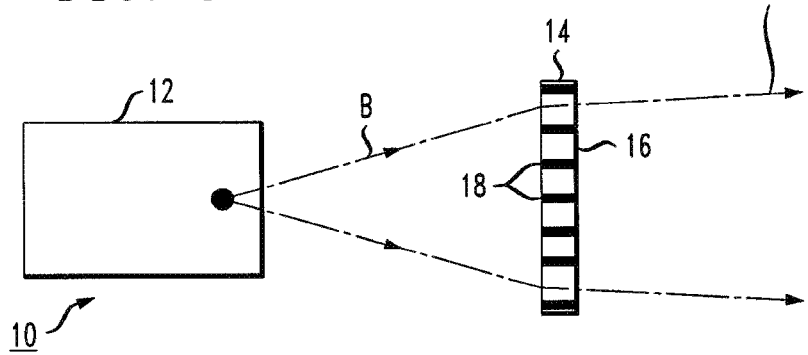
FIG. 3 is a simplified diagram of a structured light projector formed in accordance with the present invention.

FIG. 3 is a simplified block diagram of an exemplary structured light projector 10 formed in accordance with the principles of the present invention. Similar to the prior art configuration described above, a light source 12 is used to emit a beam that diverges as it exits source 12 and continues to diverge as a non-collimated beam as it propagates along an output path. In accordance with the present invention, a specialized DOE 14 is configured to interact with the non-collimated beam and create a pattern of light dots that may be essentially the same as that shown in FIG. 2.

As will be discussed in detail below, specialized DOE 14 is formed to exhibit a non-uniform pattern 16 of grating features 18, as opposed to typical DOEs that exhibit a uniform configuration to create the desired interference pattern. In particular, pattern 16 may be non-uniform in terms of the spacing between adjacent features 18 across the surface of element 14, or non-uniform in terms of thickness of features 18 within the layer of material forming specialized DOE 14, or a combination of both non-uniform spacing and non-uniform thickness. In any case, pattern 16 is specifically formed to compensate for the delay in arrival times of different portions of the non-collimated beam exiting the light source so that a desired dot pattern projection of light is formed. With this background, various embodiments of the present invention will now be discussed in detail below.

Figure 4:
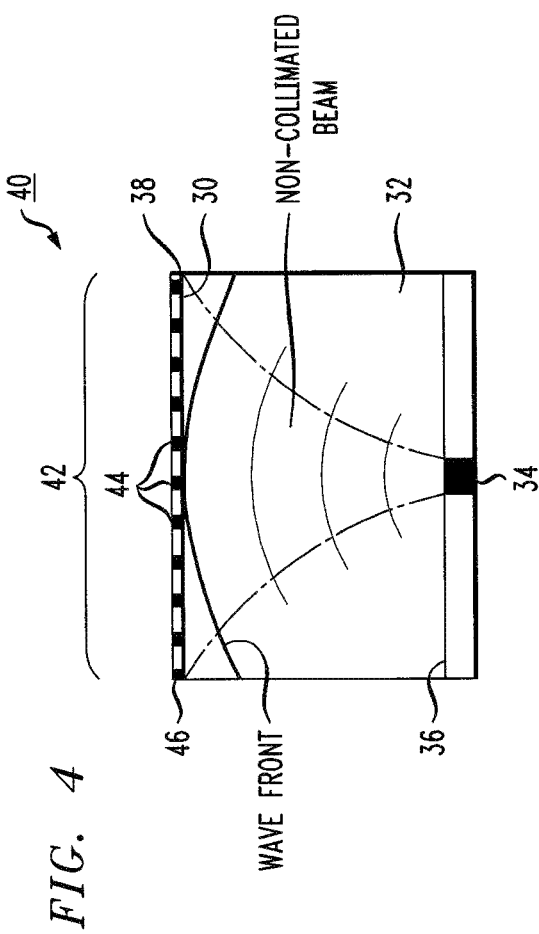
FIG. 4 illustrates a specific embodiment of the present invention, in this case comprising the combination of a VCSEL light source and specialized DOE, the specialized DOE formed to exhibit a non-uniform spacing of elements to compensate for the diverging beam.

An exemplary embodiment of the present invention that provides the desired non-uniformity in the specialized DOE pattern by controlling the spacing between adjacent features forming the grating pattern is shown in FIG. 4. In particular, FIG. 4 illustrates a monolithic, integrated structured light projector where a specialized DOE 40 of the present invention is formed on a backside 30 of a substrate 32 upon which a VCSEL device 34 is mounted and used as the light source for the projector. Also shown in FIG. 4 is a metal contact layer 38 of VCSEL 34, which is formed across backside 30 of substrate 32. In this particular embodiment, VCSEL 34 is mounted "upside-down" (i.e., epi-side down) so as to emit through the thickness of substrate 32 (instead of the usual process of emitting out of a top surface and into free space). The divergence of the emitted beam as it propagates through substrate 32 is shown by the dotted lines in FIG. 4, which also illustrates the movement of the non-planar wavefront from VCSEL device 34 toward specialized DOE 40. In accordance with this particular embodiment of the present invention, specialized DOE 40 is formed to exhibit a pattern 42 of non-uniform spacing between adjacent grating features 44. In this particular example, pattern 42 of specialized DOE 40 is specifically formed to adjust the spacing between adjacent grating features 44 so as to match the beam profile of the light emitted by VCSEL 34. That is, the spacing is controlled to compensate for the phase delay between outer regions of the wavefront with respect to the center of the wavefront. By providing this compensation in a specialized diffractive element formed in accordance with the teachings of the present invention, collimation and diffraction are both provided by a single component, creating a compact structured light projector arrangement.

In one specific configuration of this embodiment, specialized DOE 40 may be formed by depositing a layer of material 46 (such as, for example, $TiO_2$) over metal contact layer 38 and subsequently patterning and etching layer 46 to configure grating features 44 in the desired pattern 42. Alternatively, pattern 42 may be formed by directly etching features 44 into metal contact layer 38. The ability to create the diffraction pattern directly in/on the contact layer using conventional, well-known integrated circuit fabrication processes results in an extremely compact structured light projector, with the pattern aligned with beam emitted by the VCSEL. In any configuration, as long as DOE 40 creates a grating pattern of individual features 44 with different refractive index values, the beam passing through these regions will experience different degrees of diffraction and thus create the desired spot beam pattern in the farfield. By utilizing non-uniform features of some type (non-uniform size, shape, spacing, etc.), collimation of the diverging output beam from VCSEL 34 is provided by DOE 40, thus eliminating the need for a separate collimation lens.

Figure 5:
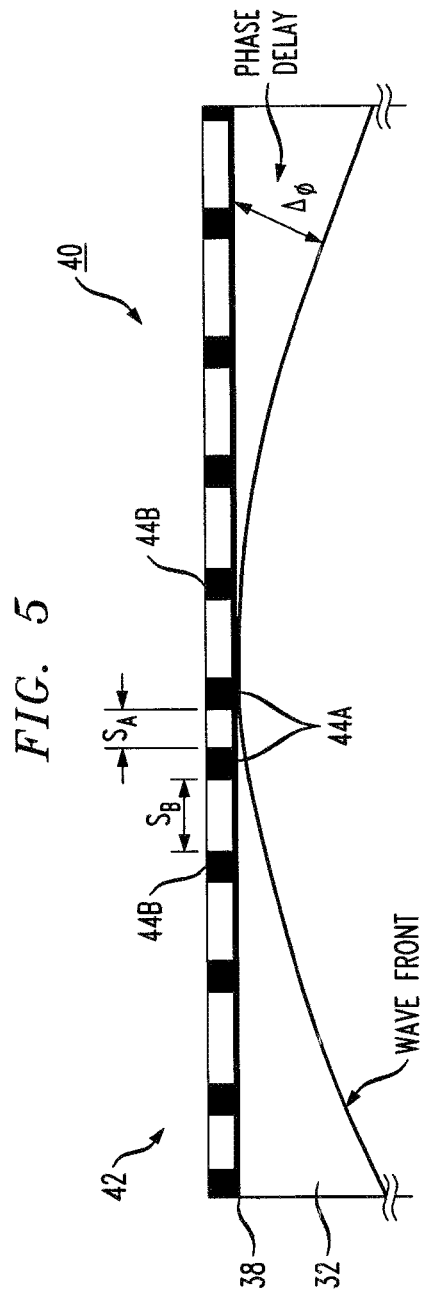
FIG. 5 is an enlarged view of the specialized DOE of FIG. 4, illustrating the wavefront of the approaching divergent beam and the non-uniform spacing of the elements in the DOE.

FIG. 5 is an enlarged view of specialized DOE 40, illustrating the non-uniformity in pattern 42, which is particularly configured to match the wavefront of the non-collimated beam output from VCSEL 34. As shown, features 44A in the center area of specialized DOE 40 are spaced relatively close together (denoted by separation $S_A$), with the spacing increasing (to a separation denoted as $S_B$) between feature 44A and 44B. This increase in spacing ($S_C$) with feature 44C, and so on, in the +x and −x directions from center feature 44A of specialized DOE 40. In accordance with this particular embodiment of the present invention, the spacing is controlled to match the phase retardation of the outer portions of the wavefront, the phase retardation shown as $\Delta\phi$, in FIG. 5.

Figure 6:
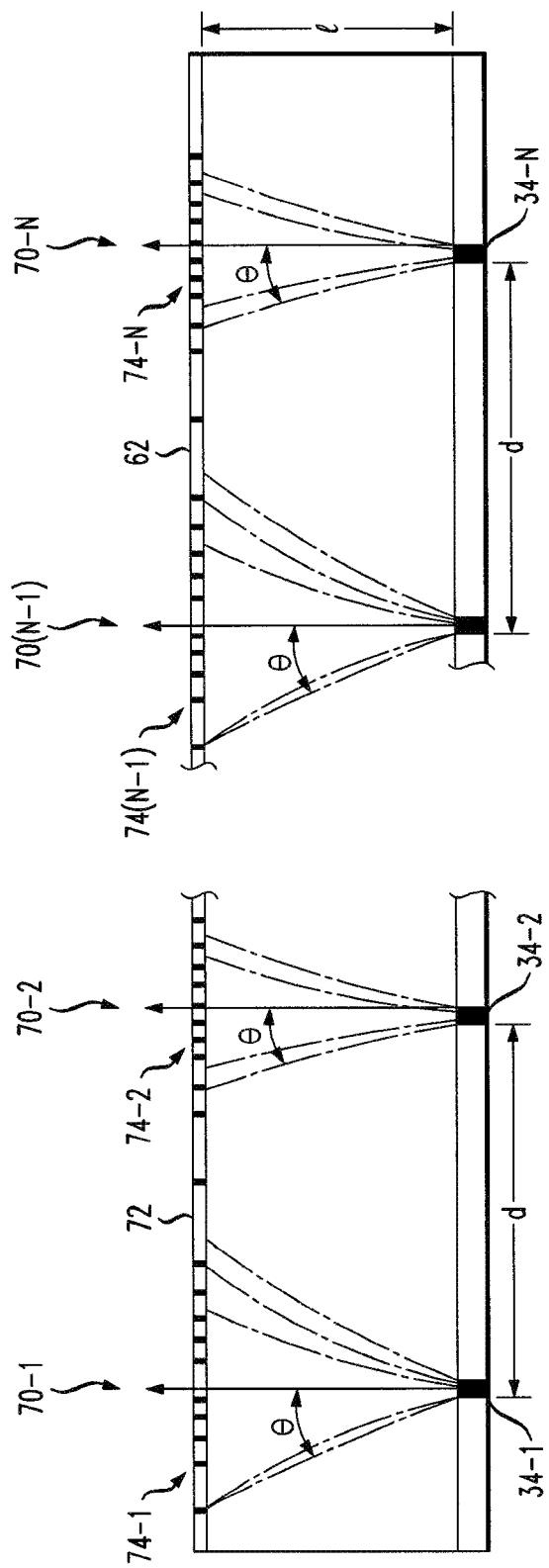
FIG. 6 illustrates another embodiment of the present invention, in this case illustrating the use of an array of light sources with associated specialized DOEs to form a structured light projector in accordance with the principles of the present invention.

As mentioned above, the specialized DOE of the present invention may be utilized with an array of light sources configured as a structured light projector instead of just a single light source. FIG. 6 illustrates an exemplary configuration including an array of VCSELs 34-1 through 34-N, disposed epi-side down on a substrate 60, such that their emitted beams propagate through the thickness of substrate 60 and exit through an n-type contact layer 62. In accordance with this particular configuration of this array embodiment of the present invention, the array of VCSELs is formed as an integrated array on a single substrate, with a plurality of separate specialized DOEs 70-1 through 70-N disposed over n-type contact layer 62 of substrate 60, each formed in alignment with its associated VCSEL 34-1 through 34-N, as shown.

In this case, DOEs 70-1 through 70-N are formed within a layer 72 of appropriate material and configured to exhibit the desired non-uniform patterns 74-1 through 74-N (non-uniform in spacing, thickness, or both). Each pattern is formed to interact with its own, separate beam to create the desired dot pattern from that emitted beam. In accordance with this embodiment of the present invention, VCSELs 34-1 through 34-N are separated by a predetermined distance d such that their divergent beams do not overlap as they pass through substrate 60. In particular, the condition is to define d as being greater than $2*T*\sin(\theta)$, where T is the thickness of substrate 60 and $\theta$ is defined as the lateral divergence of the beam, as shown in FIG. 5. In this manner, the specific patterns 74-1, 74-2, ... and 74-N formed in DOEs 70-1 through 70-N can be independently configured to provide the optimum pattern based solely on the diverging properties of their associated beams, without concern about interference by overlapping beams. Indeed, it is to be understood that each DOE may exhibit a different non-uniform diffraction pattern such that the combination of various patterns provides the desired dot pattern result. Advantageously, the use of standard integrated circuit fabrication processes allows for the formation of an array of structured light projects in straightforward fashion.

Further, it is to be understood that a larger array of VCSELs may be used as the light source for the integrated structured light projector of the present invention, including a two-dimensional array of such devices. In each case, a separate diffraction pattern is created for use in generating a spot pattern from each beam.

FIG. 7 illustrates an alternative embodiment of the present invention, where in this case the feature thickness of the specialized DOE component is controlled (instead of feature spacing) to provide the non-uniformity required to compensate for the beam divergence. In particular, FIG. 7 illustrates a specialized DOE 80 that is formed in a layer of material that is deposited over n-type (metal) contact layer 38 (as with the above-described embodiment). The material may be sequentially processed to create separate grating features 82 of different thicknesses. Here, the thicknesses of grating features 82 are shown to vary as a function of x in both directions from the center of specialized DOE 80. A thickest feature 82A is shown in the center area of DOE 80, with a pair of slightly less thick features 82B disposed on either side of feature 82A (where $t_A > t_B$). The next pair of features 82C extending outward are somewhat shorter than features 82 ($t_B > t_C$), and so on.

The thickness may be varied by using a series of patterns and etches to control the amount of material removed during each etch step. Alternatively, a controlled reactive ion etch (RIE) process may be used to tailor the thickness of features 82 and create the desired pattern. Other methods of adjusting the thickness of features 82 may be used and in all cases the thickness is modified so as to control the phase delay associated with the portion of the beam passing through a local feature 82. In particular, the thicker the feature, the longer the phase delay. Thus, by knowing the phase delay associated with the particular material used to form features 82 (as a function of the wavelength of light passing through the material), a suitable configuration of thickness non-uniformity can be developed that provides for compensation of a non-collimated output beam in accordance with the present invention.

Yet another embodiment of the present invention is shown in FIG. 8. Here, a specialized DOE 90 is formed to exhibit a combination of both a non-uniform spacing of elements and a non-uniform thickness of the elements. In this particular configuration, DOE 90 comprises a set of features 92 that are formed of either a first thickness $t_1$ or a second thickness $t_2$ (with spacings between adjacent features, as shown). The thicknesses in this particular embodiment may be related in size so as to provide a $2\pi$ phase shift to the portions of the wave traveling through the thicker feature (however, this should be considered as only one possible configuration and other values of $t_1$ and $t_2$ may be used). Features 92 are also formed to have two different widths, shown as $W_1$ and $W_2$. This combination of feature thickness and width thus forms a blazed diffractive optical element that also compensates for the non-collimated output beam from VCSEL 34. In particular, this configuration functions to help deplete the zeroth-order mode (i.e., the mode that is not diffracted).

While the above embodiments illustrate the creation of a monolithic structured light projector, it is to be understood that the specialized DOE may be formed as a separate, discrete element and disposed in alignment with a light source, such as shown in the block diagram of FIG. 3.

Recall that the prior art configuration of a structured light projector requires the alignment of a collimating lens with a standard DOE, and then the packaging of the aligned combination into a module. Following that, the module then needs to be aligned with an associated light source. As mentioned above, the present invention eliminates the need for these various alignment and packaging steps by combining the collimation and diffraction functions into a single element that can be integrated with a laser light source to a create a monolithic, structured light projector. The structured light projector of the present invention is robust and extremely compact. Without the need for additional discrete components, the fabrication process is significantly simplified and allows for an extremely compact projection product, which is a critical factor for applications in the mobile industry (e.g., projectors housed within smartphones).

It will thus be appreciated that the embodiments described above are cited by way of example, and that the present invention is not limited to what has been particularly shown and described hereinabove. Rather, the scope of the present invention includes both combinations and sub-combinations of the various described features, as well as variations and modifications thereof that would occur to persons skilled in the art upon reading the foregoing description and which are not disclosed in the prior art.

What is claimed is:

1. A structured light projector comprising
a plurality of individual laser diodes, each laser diode providing as an output a non-collimated light beam; and
a plurality of specialized diffractive optical elements disposed over and in alignment with the plurality of individual laser diodes in a one-to-one relationship, each separate diffractive optical element comprising a plurality of grating features arranged in a non-uniform pattern to both compensate for wavefront and phase retardation of the associated non-collimated beam, and thereafter diffract the associated compensated beam into non-zero diffraction orders, the plurality of specialized diffractive optical elements generating a structured light output comprising a plurality of interference patterns associated with the array of individual laser diodes.

* * * * *